(12) United States Patent
Bangert et al.

(10) Patent No.: US 11,732,345 B2
(45) Date of Patent: Aug. 22, 2023

(54) VAPOR DEPOSITION APPARATUS AND METHOD FOR COATING A SUBSTRATE IN A VACUUM CHAMBER

(71) Applicant: Applied Materials, Inc., Santa Clara, CA (US)

(72) Inventors: Stefan Bangert, Steinau (DE); Andreas Lopp, Freigericht (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/332,845

(22) Filed: May 27, 2021

(65) Prior Publication Data
US 2021/0381095 A1 Dec. 9, 2021

Related U.S. Application Data

(60) Provisional application No. 63/034,548, filed on Jun. 4, 2020.

(51) Int. Cl.
*C23C 14/24* (2006.01)
*C23C 14/16* (2006.01)
(Continued)

(52) U.S. Cl.
CPC .............. *C23C 14/24* (2013.01); *B05B 12/16* (2018.02); *B05C 21/005* (2013.01);
(Continued)

(58) Field of Classification Search
None
See application file for complete search history.

(56) References Cited

U.S. PATENT DOCUMENTS 3,511,212 A * 5/1970 Burns .................. C23C 14/042
118/721
4,220,117 A * 9/1980 Shinohara .............. G11B 5/851
427/132
(Continued)

FOREIGN PATENT DOCUMENTS

CN 100422380 C 10/2008
CN 102016103 A 4/2011
(Continued)

OTHER PUBLICATIONS

Taiwan Office Action dated May 16, 2022 for Application No. 110119639.
(Continued)

*Primary Examiner* — Jethro M. Pence
(74) *Attorney, Agent, or Firm* — Patterson + Sheridan, LLP (57) ABSTRACT

A vapor deposition apparatus is described. The vapor deposition apparatus includes a substrate support for supporting a substrate to be coated; a vapor source with a plurality of nozzles for directing vapor toward the substrate support through a vapor propagation volume; and a heatable shield extending from the vapor source toward the substrate support. The heatable shield surrounds the vapor propagation volume at least partially and includes an edge exclusion portion for masking areas of the substrate not to be coated. The substrate support may be a rotatable drum with a curved drum surface, and the vapor deposition apparatus may be configured to move the substrate on the curved drum surface past the vapor source in a circumferential direction.

18 Claims, 4 Drawing Sheets

(51) Int. Cl.
*C23C 14/54* (2006.01)
*C23C 14/04* (2006.01)
*B05B 12/16* (2018.01)
*B05C 21/00* (2006.01)
*H01J 37/32* (2006.01)

(52) U.S. Cl.
CPC ............ *C23C 14/042* (2013.01); *C23C 14/16* (2013.01); *C23C 14/54* (2013.01); *H01J 37/32752* (2013.01)

(56) References Cited

U.S. PATENT DOCUMENTS

| | | | | |
|---|---|---|---|---|
| 5,914,180 | A * | 6/1999 | Ito | G11B 5/85 428/828.1 |
| 5,993,622 | A * | 11/1999 | Szczyrbowski | H01J 37/3405 118/723 VE |
| 8,305,554 | B2 * | 11/2012 | Lee | H05K 3/143 355/71 |
| 9,614,155 | B2 * | 4/2017 | Isomura | C23C 14/12 |
| 9,777,365 | B2 * | 10/2017 | Stowell, Jr. | B05D 3/0486 |
| 9,845,530 | B2 * | 12/2017 | Inoue | C23C 16/042 |
| 10,873,058 | B2 * | 12/2020 | Lee | C23C 16/545 |
| 2002/0011212 | A1 | 1/2002 | Ogawa et al. | |
| 2005/0172897 | A1 | 8/2005 | Jansen | |
| 2007/0026141 | A1 | 2/2007 | Nakayama et al. | |
| 2008/0063901 | A1 * | 3/2008 | Nakayama | G11B 5/84 428/827 |
| 2009/0217874 | A1 * | 9/2009 | Fujinami | C23C 16/45565 118/723 I |
| 2009/0229520 | A1 * | 9/2009 | Fujinami | C23C 16/545 118/723 I |
| 2009/0229523 | A1 * | 9/2009 | Fujinami | C23C 16/545 118/723 R |
| 2009/0272322 | A1 * | 11/2009 | Fujinami | B05D 1/60 118/724 |
| 2010/0140078 | A1 * | 6/2010 | Pinarbasi | C23C 14/541 204/192.1 |
| 2010/0239482 | A1 * | 9/2010 | Takahashi | C23C 16/345 427/579 |
| 2010/0261017 | A1 * | 10/2010 | Kikuchi | C08J 7/048 428/411.1 |
| 2011/0217527 | A1 * | 9/2011 | Mochizuki | C23C 16/545 118/723 R |
| 2011/0217533 | A1 * | 9/2011 | Nishida | C23C 16/52 428/218 |
| 2012/0064260 | A1 * | 3/2012 | Suzuki | C23C 16/345 427/575 |
| 2013/0273746 | A1 * | 10/2013 | Kawato | H01L 51/0008 438/758 |
| 2013/0344257 | A1 * | 12/2013 | Fujinawa | C23C 16/545 427/569 |
| 2014/0023796 | A1 * | 1/2014 | Ejiri | H01J 37/3405 204/192.15 |
| 2014/0208565 | A1 * | 7/2014 | Lotz | C23C 14/562 118/712 |
| 2014/0212599 | A1 * | 7/2014 | Buschbeck | H01J 37/3277 118/712 |
| 2014/0212600 | A1 * | 7/2014 | Neil | C23C 16/45517 118/718 |
| 2014/0290861 | A1 * | 10/2014 | Dieguez-Campo | C23C 16/509 156/345.31 |
| 2014/0318452 | A1 * | 10/2014 | Stowell, Jr. | C23C 14/56 118/500 |
| 2014/0367250 | A1 * | 12/2014 | Hachtmann | C23C 14/562 204/298.11 |
| 2014/0370260 | A1 * | 12/2014 | Uebayashi | C23C 14/0629 428/218 |
| 2015/0238995 | A1 * | 8/2015 | Ohba | C23C 16/46 118/68 |
| 2016/0010201 | A1 * | 1/2016 | Kobayashi | C23C 14/042 427/255.5 |
| 2016/0047036 | A1 * | 2/2016 | Iwase | B05D 7/04 427/579 |
| 2016/0155986 | A1 * | 6/2016 | Ito | H01L 51/5246 438/126 |
| 2017/0092899 | A1 * | 3/2017 | Bangert | C23C 14/26 |
| 2017/0152593 | A1 * | 6/2017 | Ries | C23C 14/24 |
| 2017/0313046 | A1 * | 11/2017 | Makidera | B32B 27/36 |
| 2017/0345453 | A1 * | 11/2017 | Aizawa | C23C 14/54 |
| 2018/0066361 | A1 * | 3/2018 | Nara | C23C 16/448 |
| 2018/0119268 | A1 * | 5/2018 | Kawato | C23C 14/042 |
| 2018/0197718 | A1 * | 7/2018 | Fayet | C23C 16/26 |
| 2019/0226080 | A1 * | 7/2019 | Okami | H05K 3/00 |
| 2019/0242011 | A1 * | 8/2019 | Gertmann | C23C 14/562 |

FOREIGN PATENT DOCUMENTS

| | | |
|---|---|---|
| JP | H06033228 A | 2/1994 |
| KR | 20100026447 A | 3/2010 |
| TW | 201241207 A | 10/2012 |
| TW | 201404901 A | 2/2014 |

OTHER PUBLICATIONS

TW OA dated Feb. 11, 2022, Taiwan patent application No. 110119639.
International Search Report and Written Opinion dated Sep. 17, 2021 for Application No. PCT/US2021/034611.

* cited by examiner

VAPOR DEPOSITION APPARATUS AND METHOD FOR COATING A SUBSTRATE IN A VACUUM CHAMBER

CROSS-REFERENCE TO RELATED APPLICATIONS

This application claims benefit of U.S. Provisional Patent Application Ser. No. 63/034,548, filed on Jun. 4, 2020, which is herein incorporated by reference in its entirety.

TECHNICAL FIELD

Embodiments of the present disclosure relate to substrate coating by thermal evaporation in a vacuum chamber. Embodiments of the present disclosure further relate to the deposition of one or more coating strips on a flexible substrate via evaporation, e.g. on a flexible metal foil. In particular, embodiments relate to the deposition of lithium on a flexible foil, e.g. for the manufacture of Li-batteries. Specifically, embodiments relate to a vapor deposition apparatus, a method for coating a substrate in a vacuum chamber, and a method for installing a vapor deposition apparatus.

BACKGROUND

Various techniques for deposition on a substrate, for example, chemical vapor deposition (CVD) and physical vapor deposition (PVD) are known. For deposition at high deposition rates, thermal evaporation may be used as a PVD process. For thermal evaporation, a source material is heated up to produce a vapor that may be deposited, for example, on a substrate. Increasing the temperature of the heated source material increases the vapor concentration and can facilitate high deposition rates. The temperature for achieving high deposition rates depends on the source material physical properties, e.g. vapor pressure as a function of temperature, and substrate physical limits, e.g. melting point.

For example, the material to be deposited on the substrate can be heated in a crucible to produce vapor at an elevated vapor pressure. The vapor can be transported from the crucible to a heated vapor distributor with a plurality of nozzles. The vapor can be directed by the one or more nozzles onto a substrate in a coating volume, for example, in a vacuum chamber.

The deposition of a metal, e.g. lithium, on a flexible substrate, e.g. on a copper substrate, by evaporation may be used for the manufacture of batteries, such as Li-batteries. For example, a lithium layer may be deposited on a thin flexible substrate for producing the anode of a battery. After assembly of the anode layer stack and the cathode layer stack, optionally with an electrolyte and/or separator therebetween, the manufactured layer arrangement may be rolled or otherwise stacked to produce the Li-battery.

Surfaces of the components, e.g. the vacuum chamber walls of the vacuum chamber, may be exposed to the vapor and may be coated. Frequent maintenance to remove condensates is not practical for high volume manufacturing, e.g. web coating on thin foils. Further, expensive coating material may be wasted if components of the vacuum chamber different from the substrate are coated.

In addition, it is typically difficult to deposit a layer with accurately defined sharp edges on a substrate by evaporation, particularly if the vapor is a metal vapor and the nozzles provide large plume divergences. A shadowing effect and a material condensation on shield arrangements may lead to layer edges on the substrate that are not clearly defined and/or to a material deposition on substrate areas that are to be kept free of coating material.

Accordingly, it would be beneficial to have a vapor deposition apparatus and a method for coating a substrate in a vacuum chamber, for which maintenance cycles can be reduced and that at the same time enable sharp edges of coating layers on the substrate and coating-free substrate edges, even if the substrate is flexible or curved. Further, source material utilization is advantageously improved. Thus, production costs can be reduced and a layer quality can be improved.

SUMMARY

In light of the above, a vapor deposition apparatus, a method for coating a substrate in a vacuum chamber, and a method for installing a vapor deposition apparatus according to the independent claims are provided. Further aspects, advantages and features of the present disclosure are apparent from the description and the accompanying drawings.

According to one aspect, a vapor deposition apparatus is provided. The vapor deposition apparatus includes a substrate support for supporting a substrate to be coated; a vapor source with a plurality of nozzles for directing vapor toward the substrate support through a vapor propagation volume; and a heatable shield extending from the vapor source toward the substrate support and at least partially surrounding the vapor propagation volume, wherein the heatable shield comprises an edge exclusion portion for masking areas of the substrate not to be coated.

The edge exclusion portion may be arranged at a small distance from the substrate support, i.e. not in contact with the substrate support, such that the substrate support together with the substrate supported thereon can move past the heatable shield and past the vapor source during vapor deposition. Specifically, the heat shield may be mounted at the vapor source and protrude toward the substrate support, such that the edge exclusion portion of the heatable shield is held at a close distance (of, e.g. 2 mm or less) from the substrate support.

According to one aspect, a vapor deposition apparatus is provided. The vapor deposition apparatus includes a substrate support for supporting a substrate to be coated, wherein the substrate support is a rotatable drum with a curved drum surface; a vapor source with a plurality of nozzles for directing vapor toward the curved drum surface through a vapor propagation volume; and a heatable shield extending from the vapor source toward the curved drum surface and at least partially surrounding the vapor propagation volume, the heatable shield defining a coating window on the curved drum surface.

According to one aspect, a method for coating a substrate in a vacuum chamber is provided. The method includes moving a substrate past a vapor source on a curved drum surface of a rotatable drum in a circumferential direction; directing vapor from the vapor source toward the substrate supported on the curved drum surface through a vapor propagation volume; and heating a heatable shield that extends from the vapor source toward the curved drum surface and at least partially surrounds the vapor propagation volume.

According to one aspect, a method for coating a substrate in a vacuum chamber is provided. The method includes supporting a substrate on a substrate support; directing vapor from a vapor source toward the substrate supported on the substrate support through a vapor propagation volume;

heating a heatable shield that at least partially surrounds the vapor propagation volume; and masking areas of the substrate not to be coated with an edge exclusion portion of the heatable shield.

In methods described herein, the heatable shield is heated to a temperature (also referred to herein as an "operation temperature") for preventing or at least reducing vapor condensation on the heatable shield. Rather, vapor hitting the heatable shield may be re-evaporated and/or reflected. The "heatable shield" may therefore also be referred to herein as a "temperature-controlled shield" since the temperature of the heatable shield can be set to a predetermined operation temperature during the vapor deposition, reducing or preventing a vapor condensation on the heatable shield.

According to one aspect, a method for installing a vapor deposition apparatus is provided. The method includes providing a rotatable drum with a curved drum surface for supporting a substrate and a vapor source for directing vapor toward the curved drum surface; and mounting a heatable shield such that the heatable shield extends from the vapor source toward the curved drum surface and defines a coating window, wherein the heatable shield comprises an edge exclusion portion extending along the curved drum surface in a circumferential direction and following a curvature thereof.

According to one aspect, a method of manufacturing a coated substrate in the vapor deposition apparatus according to any of the embodiments described herein is provided. The method includes supporting a substrate on the substrate support of the vapor deposition apparatus; and directing vapor from the vapor source of the vapor deposition apparatus toward the substrate for depositing one or more coating strips on the substrate.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the present disclosure are also directed at methods for manufacturing the described apparatuses and products, and methods of operating the described apparatus. Described embodiments include method aspects for carrying out every function of the described apparatuses.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Within the following description of the drawings, the same reference numbers refer to the same or similar components. Generally, only the differences with respect to the individual embodiments are described. Unless specified otherwise, the description of a part or aspect in one applies to a corresponding part or aspect in another embodiment as well.

According to embodiments of the present disclosure, apparatuses and methods for coating by evaporation in a vacuum chamber are provided. For depositing a substrate with a source material by evaporation, the source material may be heated inside a vapor source, e.g. inside a crucible of the vapor source, above the evaporation or sublimation temperature of the source material. Embodiments of the present disclosure result in reduced condensation on surfaces other than the substrate surface, such that cleaning efforts and waste of material due to stray coating in the vacuum chamber can be reduced. In addition, embodiments of the present disclosure provide a clearly defined and sharp coating layer edge on the substrate, even if the substrate is flexible and/or in a curved state during the vapor deposition. Yet further, embodiments disclosed herein allow for an accurate substrate edge masking, even if the substrate is coated while being arranged on a moving substrate support, particularly on the curved drum surface of a coating drum.

Figure 1:
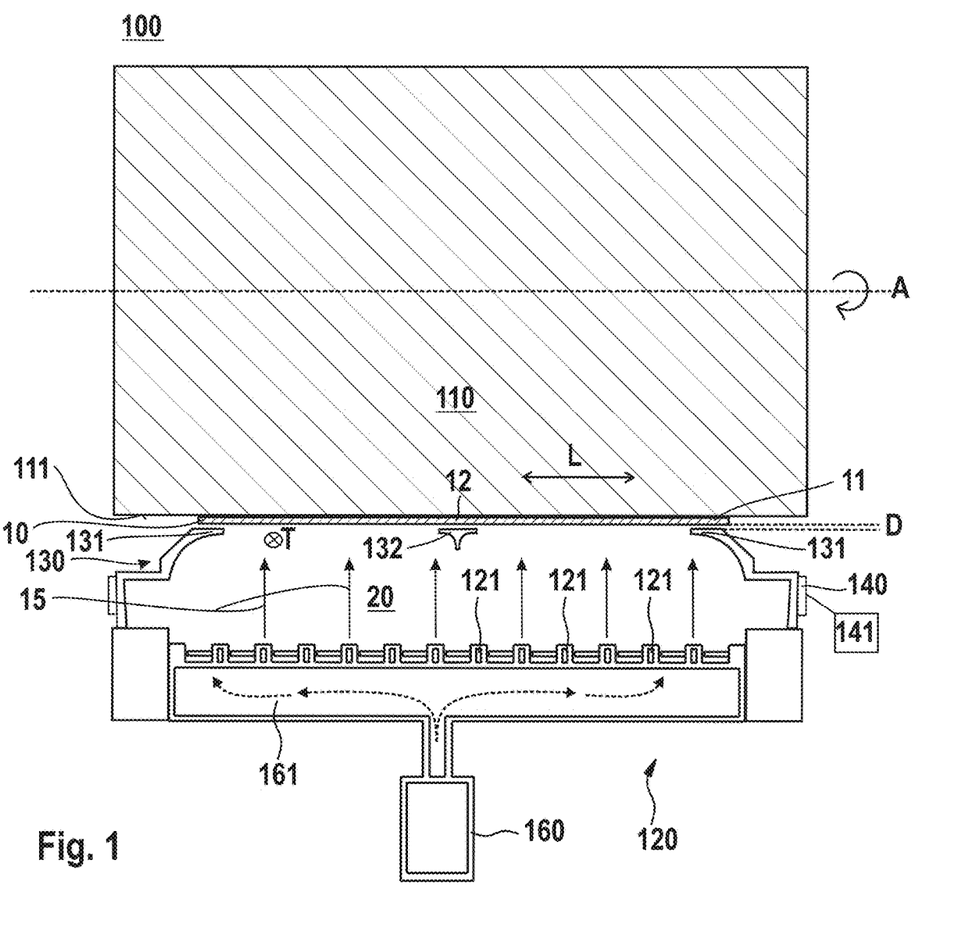
FIG. 1 shows a schematic sectional view of a vapor deposition apparatus according to embodiments of the present disclosure.

FIG. 1 is a schematic view of a vapor deposition apparatus 100 according to embodiments described herein. The vapor deposition apparatus 100 includes a substrate support 110 for supporting a substrate 10 that is to be coated. The vapor deposition apparatus 100 further includes a vapor source 120 with a plurality of nozzles 121 for directing vapor 15 toward the substrate support 110 through a vapor propagation volume 20. The vapor propagation volume 20 may be understood as a volume or space between the vapor source 120 and the substrate support through which the vapor is directed by the plurality of nozzles 121. It is beneficial if at least most of the vapor that is emitted by the plurality of nozzles 121 is confined in the vapor propagation volume 20, i.e. in a defined volume downstream of the plurality of nozzles 121, such that a stray coating of other components inside the vacuum chamber but outside the vapor propagation volume 20, e.g. of vacuum chamber walls, can be reduced or avoided.

In some embodiments described herein, the substrate support 110 is movable, such that the substrate 10 can be moved past the vapor source 120 during vapor deposition. An accurate masking of areas of the substrate 10 that are to be kept free of coating material, specifically an accurate masking of substrate edges (also referred to herein as "edge exclusion") is challenging, particularly if the substrate moves past the vapor source 120 during the vapor deposition.

In some implementations, the substrate support 110 is a rotatable drum with a curved drum surface 111, and the vapor deposition apparatus is configured to move the substrate 10 on the curved drum surface 111 past the vapor source 120 in a circumferential direction T. For example, the substrate may be a flexible web or foil, and the vapor deposition system may be a roll-to-roll deposition system. An accurate masking of areas of a substrate that are not to be coated is particularly challenging if the substrate moves and is supported on a curved drum surface 111 during the vapor deposition, because a distance between the vapor source and the substrate support where the substrate is supported may vary in the circumferential direction T due to the curvature of the curved drum surface 111.

A "circumferential direction T" as used herein may be understood as the direction along the circumference of the coating drum that corresponds to the movement direction of the curved drum surface 111 when the coating drum rotates around an axis A. The circumferential direction corresponds to the substrate transport direction when the substrate is moved past the vapor source 120 on the curved drum surface. In some embodiments, the coating drum may have a diameter in a range of 300 to 1400 mm or larger. As already mentioned above, reliably shielding the vapor 15 downstream of the plurality of nozzles 121 for confining the vapor in the vapor propagation volume 20 and providing accurately defined and sharp layer edges is particularly difficult when a flexible substrate is coated that is moved on a curved drum surface, because the vapor propagation volume and the coating window may have a complex shape in this case. Embodiments described herein enable a reliable and accurate edge exclusion and material shielding also in vapor deposition apparatuses configured to coat a web substrate provided on a curved drum surface.

The vapor deposition apparatus 100 may be a roll-to-roll deposition system for coating a flexible substrate, e.g. a foil. The substrate to be coated may have a thickness of 50 µm or less, particularly 20 µm or less, or even 6 µm or less. For example, a metal foil or a flexible metal-coated foil may be coated in the vapor deposition apparatus. In some implementations, the substrate 10 is a thin copper foil or a thin aluminum foil having a thickness below 30 µm, e.g. 6 µm or less. The substrate could also be a thin metal foil (e.g. a copper foil) coated with graphite, silicon and/or silicon oxide, or a mixture thereof, e.g. in a thickness of 150 µm or less, particularly 100 µm or less, or even down to 50 µm or less. According to some implementations, the web may further comprise graphite and silicon and/or silicon oxide. For example, the lithium may pre-lithiate the layer including graphite and silicon and/or silicon oxide.

In a roll-to-roll deposition system, the substrate 10 may be unwound from a storage spool, at least one or more material layers may be deposited on the substrate while the substrate is guided on the curved drum surface 111 of a coating drum, and the coated substrate may be wound on a wind-up spool after the deposition and/or may be coated in further deposition apparatuses.

According to embodiments described herein, the vapor deposition apparatus further includes a heatable shield 130 that extends from the vapor source 120 toward the substrate support 110 and at least partially surrounds the vapor propagation volume 20. In particular, the heatable shield 130 may be mounted at the vapor source 120, e.g. at a periphery of the vapor source 120, or at another stationary support in the vacuum chamber, and may extend from the vapor source 120 toward the substrate support 110. The heatable shield 130 may be mounted stationary in a vacuum chamber of the vapor deposition apparatus, i.e. the heatable shield does not move together with the substrate support 110. The heatable shield 130 may be shaped such that the heatable shield at least partially or entirely surrounds the vapor propagation volume 20, reducing or preventing a propagation of the vapor 15 outside the vapor propagation volume. In other words, the heatable shield 130 may form a side wall of the vapor propagation volume 20 and confine the vapor 15 or at least a major part thereof in the vapor propagation volume. A stray coating on surfaces outside the vapor propagation volume 20 that is (at least partially or entirely) surrounded by the heatable shield can be reduced, and the cleaning of the apparatus can be facilitated.

In particular, the heatable shield 130 may be arranged at least at two opposite lateral sides of the vapor propagation volume 20, as is schematically depicted in the sectional view of FIG. 1, preventing vapor from exiting the vapor propagation volume 20 toward the left and right sides in FIG. 1, i.e. in the lateral direction L that extends along the axis A of the coating drum. Additionally, in some embodiments, the heatable shield 130 may also be arranged at at least one of a substrate entrance side (defining a substrate entrance wall of the vapor propagation volume 20) and a substrate exit side (defining a substrate exit wall of the vapor propagation volume 20) of the vapor propagation volume 20 (not shown in FIG. 1, but visible in FIG. 4 where the heatable shield provides a shielding wall also at the substrate exit side 137 of the vapor propagation volume 20). If two or more vapor sources are arranged adjacent to each other at a periphery of a coating drum (see FIG. 3), two or more vapor propagation volumes of two or more vapor sources may not be fully separated from each other by the heatable shield, i.e. the heatable shield may have a partially open side wall 138 or no side wall at an interface between the two adjacent vapor sources (see FIG. 4).

Returning to FIG. 1, the heatable shield 130 does not contact the substrate support 110, such that the substrate supported on the substrate support 110 can move past the vapor source 120 and past the heatable shield 130 during vapor deposition. The heatable shield 130 may only leave a small gap between the heatable shield 130 and the substrate support 110, e.g. a gap of 5 mm or less, 3 mm or less, 2 mm or less, or even about 1 mm or less, such that hardly any vapor can propagate past the heatable shield in the lateral direction L.

The heatable shield 130 is heatable, such that vapor condensation on the heatable shield 130 can be reduced or prevented when the heatable shield 130 is heated to an operation temperature, e.g. an operation temperature of 500° C. or more in some embodiments. Preventing vapor condensation on the heatable shield 130 is beneficial because cleaning efforts can be reduced. Further, a coating on the heatable shield 130 may change the dimensions of a coating window that is provided by the heatable shield. In particular, if a gap in the range of only few millimeters, e.g. of about 1 mm or less, is provided between the heatable shield 130 and the substrate support 110, a coating on the heatable shield would lead to a change in the gap dimensions and hence to an undesired change in an edge shape of a coating layer deposited on the substrate. Further, source material utilization can be improved when no source material accumulates on the heatable shield. Specifically, essentially all of the source material propagating inside the vapor propagation volume 20 can be used for coating the substrate surface if the heatable shield is heated to the operation temperature that may be above a vapor condensation temperature.

A "vapor condensation temperature" as used herein may be understood as a threshold temperature of the heatable shield above which the vapor 15 no longer condenses on the heatable shield. The operation temperature of the heatable shield 130 may be at or (slightly) above the vapor condensation temperature. For example, the operation temperature of the heatable shield may be between 5° C. and 50° C. above the vapor condensation temperature in order to avoid an excessive heat radiation toward the substrate support. It is to be noted that the vapor condensation temperature may depend on the vapor pressure. Since the vapor pressure downstream of the plurality of nozzles 121 in the vapor propagation volume 20 is lower than the source pressure inside a crucible 160 and/or inside a distributor 161 of the vapor source 120, the vapor inside the vapor source 120 may condense already at a lower temperature than the vapor 15 inside the vapor propagation volume 20. The "vapor condensation temperature" as used herein relates to the temperature of the heatable shield downstream of the plurality of nozzles in the vapor propagation volume 20 that avoids a vapor condensation on the heatable shield. The "evaporation temperature" as used herein relates to a temperature inside the vapor source 120 upstream of the plurality of nozzles 121 at which the source material evaporates. The evaporation temperature within the vapor source 120 is typically higher than the vapor condensation temperature inside the vapor propagation volume 20. For example, the evaporation temperature inside the vapor source may be set to a temperature above 600° C., whereas the vapor condensation temperature downstream of the plurality of nozzles 121 may be below 600° C., e.g. from 500° C. to 550° C., if lithium is evaporated. In embodiments described herein, the temperature inside the vapor source may be 600° C. or more, whereas the operation temperature of the heatable shield may be set at less than 600° C., e.g. from 500° C. to 550° C. during vapor deposition.

Vapor hitting the heatable shield that is provided at the operation temperature of, e.g. 500° C. to 550° C., may be immediately re-evaporated or reflected from the heatable shield surface, such that the respective vapor molecules end up on the substrate surface rather than on the heatable shield surface. Material accumulation on the heatable shield can be reduced or prevented, and cleaning efforts can be reduced.

The "heatable shield" may also be referred to herein as a "temperature-controlled shield" since the temperature of the heatable shield can be set to the predetermined operation temperature during the vapor deposition, reducing or preventing the vapor condensation on the heatable shield. In particular, the temperature of the heatable shield can be controlled to be maintained in a predetermined range. A controller and a respective heating arrangement controlled by the controller may be provided for controlling the temperature of the heatable shield during vapor deposition.

According to embodiments described herein, the heatable shield 130 includes an edge exclusion portion 131 for masking areas of the substrate not to be coated. In particular, a front portion of the heatable shield 130 that is arranged close to the substrate support 110 and may provide a projecting free end thereof may be configured as an edge exclusion mask that masks areas of the substrate, such as substrate edges, that are to be kept free of coating material. In particular, one or two opposing lateral substrate edges 11 in the lateral direction L may be kept free of coating material due to edge exclusion portions 131 of the heatable shield 130 that act as an edge exclusion mask. For being able to act as an edge exclusion mask, the edge exclusion portion 131 needs to be arranged at a close distance from the substrate during vapor deposition, specifically at a distance of 2 mm or less or 1.5 mm or less, particularly about 1 mm or less (e.g., 1 mm+/−20%). Since a thickness of the substrate is typically 50 μm or less, particularly between 6 μm and 10 μm, a distance between the substrate and the edge exclusion portion essentially corresponds to a distance between the substrate support and the edge exclusion portion, such that the substrate thickness may be negligible in this respect. A gap between the edge exclusion portion 131 and the substrate of 2 mm or more during deposition may already lead to a considerable vapor propagation into the gap from distantly arranged nozzles having a large plume divergence, preventing an edge exclusion and providing sloping layer edges and coated substrate edges.

According to embodiments described herein, a distance D between the edge exclusion portion 131 and the substrate support 110 is typically 2 mm or less, particularly 1 mm or less, when the heatable shield is heated to the operation temperature. Hence, the edge exclusion portion 131 of the heatable shield 130 can act as an edge exclusion mask, masking the substrate edges and providing sharp and well-defined coating layer edges. For example, a coating layer thickness may drop from 100% to 1% or less within a range of 3 mm or less in the lateral direction L at a lateral coating layer edge.

The dimensions of the heatable shield 130 may expand when the heatable shield is heated from room temperature (about 20° C.) to the operation temperature, e.g. to an operation temperature of 500° C. or more. Accordingly, due to said thermally induced expansion, the edge exclusion portion 131 may move closer toward the substrate support 110 during the heating of the heatable shield. According to embodiments described herein, the heatable shield 130 is shaped and mounted such that the width of a gap between the edge exclusion portion 131 and the substrate support 110 is reduced to an essentially constant gap width of 2 mm or less, particularly about 1 mm, when the heatable shield is heated to the operation temperature, e.g. to a temperature between 500° C. and 600° C.

According to embodiments described herein, a maximum distance D between the edge exclusion portion 131 and the substrate support 110 may be 2 mm or more and 6 mm or less, when the heatable shield is not heated, i.e. provided at a room temperature (about 20° C.). The heatable shield may be positioned with a variable distance (i.e., unsymmetrically positioned) with respect to the substrate support, such that the distance becomes essentially constant by heating the heatable shield to the operation temperature. On the other hand, when the heatable shield is heated to the operation temperature (e.g., between 500° C. and 600° C.), the maximum distance D between the edge exclusion portion 131 and the substrate support may be less than 2 mm, particularly 1.5 mm or less, more particularly about 1 mm, or even less than 1 mm. On the other hand, the heatable shield may be dimensioned and mounted such that, even at the operation temperature, the heatable shield does not contact the substrate support. In some embodiments described herein, an essentially constant gap width of 1 mm is provided between the edge exclusion portion 131 of the heatable shield and the substrate support 110, when the heatable shield is heated to the operation temperature. The gap width D may be essentially constant over the extension of the gap in the circumferential direction T, e.g. the gap width D may be constantly between 0.8 mm and 1.5 mm, particularly about 1 mm (1 mm+/−15%) in the circumferential direction T.

Figure 3:
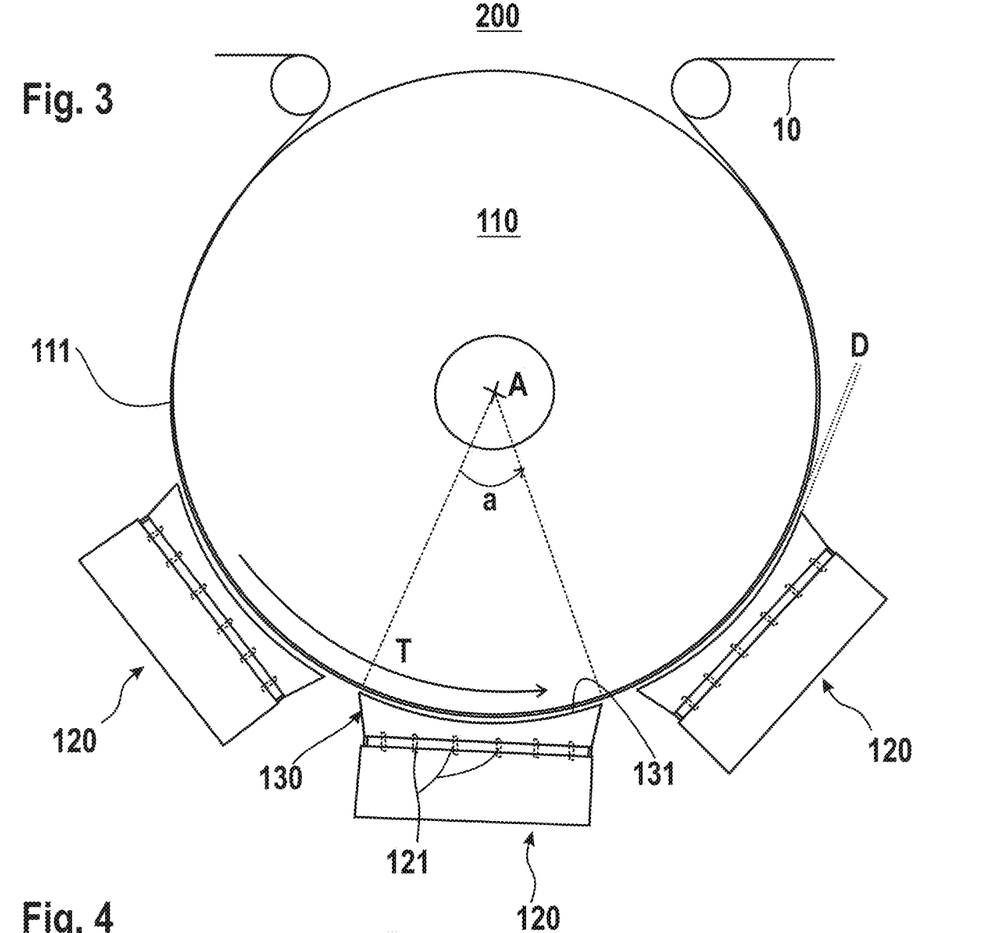
FIG. 3 shows a schematic view of a vapor deposition apparatus according to embodiments of the present disclosure.
Figure 4:
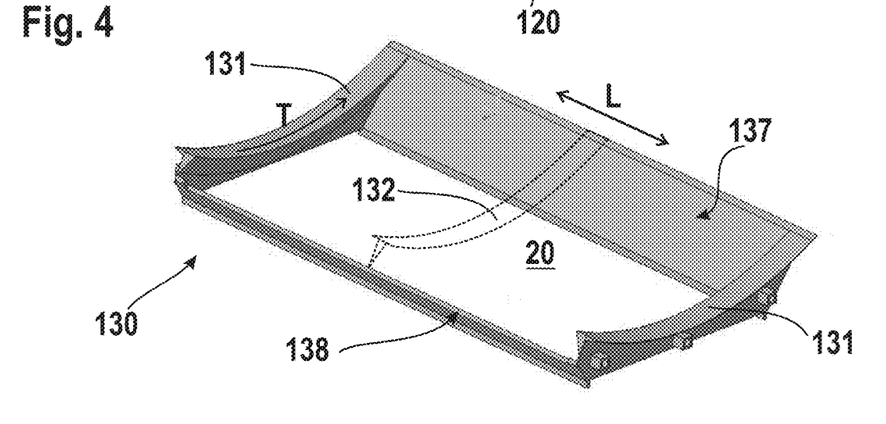
FIG. 4 shows a perspective view of a heatable shield of a vapor deposition apparatus according to embodiments of the present disclosure.

If the substrate support 110 is a rotatable drum with a curved drum surface 111 on which the substrate is supported during deposition, the edge exclusion portion 131 of the heatable shield 130 may extend along the curved drum surface 111 in the circumferential direction T and follow a curvature thereof, as is schematically depicted in FIG. 3 and FIG. 4. Specifically, when the heatable shield is not heated, the maximum distance D between the edge exclusion portion 131 and the curved drum surface 111 may be 2 mm or more and 6 mm or less, and/or when the heatable shield is heated to the operation temperature, the maximum distance D between the edge exclusion portion and the curved drum surface may be 2 mm or less, particularly about 1 mm. Specifically, in the heated state of the heatable shield, the distance D between the edge exclusion portion 131 and the curved drum surface 111 may be essentially constant along the gap extension in the circumferential direction T, e.g. having an essentially constant value of 1.5 mm or less and 0.8 mm or more. Accordingly, one lateral substrate edge or two opposing lateral substrate edges 11 can be reliably excluded from deposition, even if the substrate is arranged on the curved drum surface 111 during the vapor deposition.

In some embodiments, which can be combined with other embodiments described herein, the edge exclusion portion 131 is configured to mask two opposing lateral substrate edges 11. For example, as it is schematically depicted in FIG. 1, edge exclusion portions 131 protrude toward a first substrate edge in the lateral direction L and toward a second opposite substrate edge in the lateral direction L, masking the two outer opposing lateral substrate edges 11, preventing a material coating on these substrate edges and ensuring well-defined coating layer edges.

Figure 2:
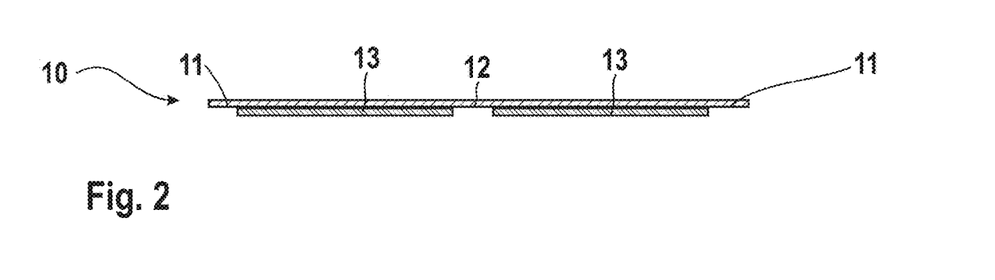
FIG. 2 shows a schematic sectional view of a coated substrate manufactured according to embodiments of the present disclosure.

FIG. 2 shows a schematic sectional view of a coated substrate 10 manufactured in any of the vapor deposition apparatuses described herein. The two opposing lateral substrate edges 11 are essentially free of coating material due to the masking by the edge exclusion portion 131 of the heatable shield. A coating layer or two or more coating strips 13 with well-defined outer edges are deposited. A strip of coating material having defined and sharp outer edges can be deposited on the substrate. In the example depicted in FIG. 2, two separate coating strips of coating material having respective defined and sharp edges are deposited on the substrate 10. An inner substrate area 12 may be kept free of coating material.

Returning to FIG. 1, the heatable shield 130 may (optionally) have a segmentation portion 132 for masking an inner substrate area 12, e.g. for enabling a deposition of two or more coating strips. If the segmentation portion 132 extends centrally between the edge exclusion portions 131, two separate strips of coating material having an essentially equal width in the lateral direction L can be deposited on the substrate. The segmentation portion 132 may be arranged between the edge exclusion portions 131 that mask the outer substrate edges, and the segmentation portion 132 may extend in the circumferential direction. The segmentation portion 132 may have a width in the lateral L direction of 1 cm or more and 10 cm or less. Accordingly, several coating strips which are spaced apart could be arranged even or unevenly over the surface of the substrate 11.

In some implementations, the segmentation portion 132 may divide a coating window that is provided by the heatable shield 130 into two or more sub-windows, such that two or more coating strips can be deposited on the substrate. The segmentation portion 132 may be arranged close to the substrate support 110 during vapor deposition, acting as an edge exclusion mask portion that masks an inner substrate area 12 that is not to be coated, i.e. that is to be kept free of coating material. The segmentation portion 132 may be arranged at a close distance to the curve drum surface 111, e.g., at a distance of 2 mm or less. Accordingly, sharp inner edges of the two coating strips 13 that are deposited on the two lateral sides of the segmentation portion 132 can be provided. In some embodiments, several segmentation portions 132 may be provided that divide the coating window into three or more sub-windows, such that three or more coating strips can be deposited on the substrate. For example, the one or more segmentation portion(s) 132 may divide the coating window into two or more sub-windows having an equal width in the lateral direction L. Hence, two, three or more coating strips 13 having an essentially equal width and sharp and well-defined edges can be deposited on the substrate.

The coating window that is defined by the heatable shield 130 may have a width of 80% or more, particularly 90% or more, of a substrate width in the lateral direction L. The lateral substrate edges 11 in the lateral direction L are masked by the heating shield. The coating window may be configured as one single opening or may be divided in two, three, four or more sub-windows. Accordingly, either one single continuous material layer may be deposited on the substrate if no segmentation portion 132 is provided, or alternatively two, three or more coating strips may be deposited on the substrate if one, two or more segmentation portions are provided. The width of the coating window in the lateral direction L may be 20 cm or more and 1 m or less, such that a coating strip having a width of 20 cm or more and 1 m or less can be deposited in some embodiments. Alternatively, the width of each of several sub-windows in the lateral direction may be 5 cm or more and 50 cm or less, such that several coating strips having a width each of 5 cm or more and 50 cm or less, particularly 20 cm or more and 40 cm or less, can be deposited on the substrate through a heatable shield having one or more segmentation portions.

In some embodiments, which can be combined with other embodiments described herein, the vapor source 120 may be configured to evaporate a metal, particularly a metal having an evaporation temperature of 500° C. or more, particularly 600° C. or more. In some implementations, the vapor source 120 may be configured to deposit a lithium layer on the substrate. The vapor source 120 may include a crucible 160 configured to be heated to a temperature of 600° C. or more, particularly 800° C. or more, and a distributor 161 configured to guide the vapor from the crucible 160 to the plurality of nozzles 121, wherein an inner volume of the distributor can be heated to a temperature of 600° C. or more, particularly 800° C. or more.

The vapor deposition apparatus may further include a heating arrangement 140 for actively or passively heating the heatable shield 130 to an operation temperature above a vapor condensation temperature, particularly to a temperature of 500° C. or more and 600° C. or less, particularly 500° C. or more and 550° C. or less. If the temperature of a surface of the heatable shield 130 is below the vapor condensation temperature, the vapor 15 can condense on a surface of the heatable shield. Accordingly, the operation temperature of the heatable shield may be controlled to be above the vapor condensation temperature. Specifically, the operation temperature of the heatable shield may be only slightly above the vapor condensation temperature, e.g. 10° C. or more and 50° C. or less above the vapor condensation temperature, in order to avoid an excessive heat load toward the substrate.

In some embodiments, the vapor deposition apparatus includes a controller 141 connected to the heating arrangement 140, the controller 141 configured to control the temperature of the heatable shield 130 to be lower than a temperature inside the vapor source 120 and higher than the vapor condensation temperature. The heatable shield may therefore also be referred to herein as a "temperature-controlled shield". The operation temperature of the heatable shield should be as low as possible, in order to reduce the heat load toward the substrate, but should be high enough to prevent vapor condensation on the heatable shield. The operation temperature of the heatable shield is typically less than the evaporation temperature inside the vapor source 120, e.g., inside a crucible 160 or a distributor 161 of the vapor source, because the pressure inside the vapor source 120 is typically higher than the pressure inside the vapor propagation volume 20 downstream of the plurality of nozzles 121.

FIG. 3 shows a schematic view of a vapor deposition apparatus 200 according to embodiments described herein, viewed in a direction along the rotation axis A of the substrate support 110 that is configured as a rotatable drum. The vapor deposition apparatus 200 may include some or all of the features of the vapor deposition apparatus 100 shown in FIG. 1, such that reference can be made to the above explanations, which are not repeated here. A substrate 10 that is flexible, e.g. a thin foil substrate, can be moved past the vapor source 120 of the vapor deposition apparatus 200 on the curved drum surface 111.

The vapor source 120 includes a plurality of nozzles 121 for directing vapor toward the curved drum surface 111 through the vapor propagation volume. Further, the heatable shield 130 is provided. The heatable shield 130 extends from the vapor source 120 toward the curved drum surface 111 and at least partially surrounds the vapor propagation volume. In some embodiments, the heatable shield 130 defines a coating window on the curved drum surface, i.e. an area on the curved drum surface where vapor molecules directed from the vapor source can impinge on the substrate supported on the curved drum surface. In some embodiments, the vapor source 120 is mounted and extends along a periphery of the rotatable drum, such that the plurality of nozzles 121 of the vapor source 120 are directed toward the curved drum surface 111.

For example, the coating window that is defined by the heatable shield 130 associated to one vapor source 120 may extend over an angular range of 10° or more and 45° or less of the curved drum surface 111 in the circumferential direction T. Two, three or more vapor sources 120 may be arranged next to each other in the circumferential direction, e.g., for depositing several material layers on the substrate or for depositing one thick material layer of the same material on the substrate. In one embodiment, two, three or more metal evaporation sources, particularly lithium sources, are arranged adjacent to each other in the circumferential direction T of one rotatable drum, such that a thick metal layer can be deposited on the substrate, while the substrate moves on the curved drum surface 111 of one rotating drum.

The coating windows defined by the heatable shields 130 of adjacent vapor sources may be separate (as it is schematically depicted in FIG. 3), or alternatively, the coating windows defined by the heatable shields 130 of adjacent vapor sources may partially overlap. For example, separation walls provided by the heatable shields associated to two adjacent vapor sources may be partially open. A heatable shield with a partially open side wall 138 that defines the interface between two adjacent coating windows is depicted in FIG. 4.

According to embodiments described herein, the heatable shield 130 includes an edge exclusion portion 131 extending in a circumferential direction T of the rotatable drum and configured to mask areas of the substrate not to be coated. For example, a first lateral edge of the substrate and a second lateral edge of the substrate opposite the first lateral edge may be excluded from deposition. The edge exclusion portion 131 may follow a curvature of the curved drum surface along the circumferential direction T, such that the lateral edges of the substrate are accurately masked when the substrate moves along a curved transport path defined by the curved drum surface.

In particular, a distance D between the edge exclusion portion 131 and the curved drum surface 111 may be 2 mm or less, particularly about 1 mm, along the full extension of the edge exclusion portion 131 in the circumferential direction T when the heatable shield is heated to the operation temperature. The edge exclusion portion 131 may extend in the circumferential direction T over 20 cm or more, 30 cm or more, or even 50 cm or more. Specifically, a circumferentially-extending gap is provided between the edge exclusion portion 131 and the curved drum surface 111, the gap having an essentially constant gap width between about 0.8 mm and about 1.5 mm when the heatable shield is heated to the operation temperature, particularly a constant gap width of about 1 mm.

FIG. 4 shows a perspective view of a heatable shield 130 of a vapor deposition apparatus described herein. The heatable shield 130 may have at least two opposing lateral side walls defining the vapor propagation volume 20 therebetween. Edge exclusion portions 131 may be provided at a front of the two opposing lateral side walls and be configured for masking opposing substrate edges. As is schematically depicted in FIG. 4, the edge exclusion portion 131 may have curved front surfaces with a curvature adapted to a curvature of the coating drum. The edge exclusion portions 131 may become thinner when approaching respective masking rims that define the coating layer edges and are arranged particularly close to the curved drum surfaces during deposition. After mounting to the vapor source, the two opposite lateral side walls of the heatable shield 130 may protrude from the vapor source toward the curved drum surface, leaving a small gap between the edge exclusion portions 131 and the curved substrate surface. The gap has an essentially constant gap width along the circumferential direction when the heatable shield is heated to the operation temperature.

The edge exclusion portions 131 are curved, following exactly a curvature of the curved drum surface during vapor deposition, such that a constant small gap width is provided between the edge exclusion portions 131 and the curved drum surface 111 when the heatable shield is heated to the operation temperature and has thermally expanded.

Optionally, the heatable shield 130 may further include a segmentation portion 132 that is arranged between the edge exclusion portions 131 and is configured for masking an inner substrate area. In FIG. 4, the segmentation portion 132 is depicted in dashed lines as being optional. The curvature progression of the segmentation portion 132 in the circumferential direction may correspond to the curvature progression of the edge exclusion portion 131 in the circumferential direction T, leading to a constant and small gap between the segmentation portion 132 and the curved drum surface 111 during vapor deposition, when the heatable shield 130 (including the segmentation portion 132) is heated to the operation temperature. In some embodiments, two, three or more segmentation portions 132 are arranged between the edge exclusion portions 131, e.g. with an even spacing therebetween. Accordingly, two, three or more coating strips that may have an essentially equal lateral width can be deposited on the substrate.

Figure 5A:
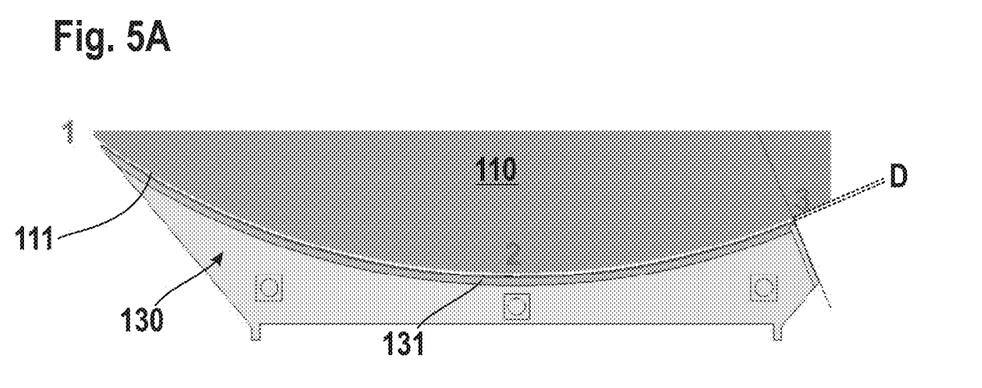
FIGS. 5A and 5B show partial sectional views of vapor deposition apparatuses according to embodiments of the present disclosure. The heatable shield is not heated in FIG. 5A, and the heatable shield is heated to an operation temperature in FIG. 5B.
Figure 5B:
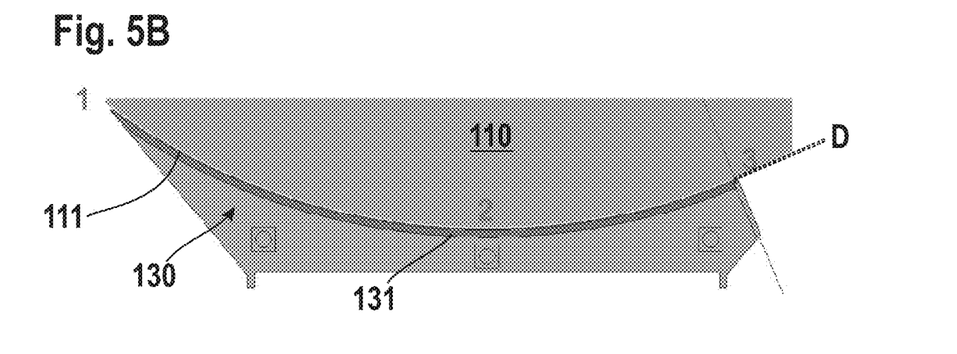

FIG. 5A and FIG. 5B respectively show a part of a substrate support 110 in the form of a rotatable drum with a curved drum surface 111. A heatable shield 130 as described herein that defines a coating window faces toward the curved drum surface 111, such that a small and essentially constant gap is provided between an edge exclusion portion 131 of the heatable shield 130 and the curved drum surface 111. FIG. 5A shows the heatable shield at room temperature, i.e. in an unheated state, and FIG. 5B shows the heatable shield at an operation temperature, e.g., during vapor deposition. The operation temperature of the heatable shield may be 200° C. or more, particularly 300° C. or more, 400° C. or more, or even 500° C. or more, e.g. between 500° C. and 600° C., depending on the source material that is evaporated, such that vapor condensation on the heatable shield can be reduced or prevented.

The rotatable drum may have a radius of 0.2 m or more, particularly 0.5 m or more, e.g. about 0.7 m. The radius of curvature of the edge exclusion portion may essentially correspond to the radius of curvature of the curved drum surface, i.e. the edge exclusion portion 131 may follow a curvature of the curved drum surface 111.

In FIG. 5A, the gap width D between the edge exclusion portion 131 and the curved drum surface 111 may be, at least in sections, larger than the respective gap width D in FIG. 5B, i.e., after heating of the heatable shield to the evaporation temperature. The reason is that the heatable shield may thermally expand during the heating. In FIG. 5B, the gap width D is essentially constant and very small over the whole extension of the heatable shield along the circumferential direction. In FIG. 5A, the gap width may be slightly varying in the circumferential direction, e.g., with a variation range that may be 0.5 mm or more and 3 mm or less—depending on (1) the thermal expansion coefficient of the material of the heatable shield, (2) the operation temperature, (3) the angular extension of the heatable shield in the circumferential direction, and/or (4) the positions of the fixing points of the heatable shield.

For example, if the heatable shield is radially fixedly mounted at end portions thereof in the circumferential direction, allowing a central portion of the heatable shield to radially move, a first distance between the edge exclusion portion and the curved drum surface in a center section of the heatable shield (marked (2) in FIG. 5A and FIG. 5B) becomes smaller when the heatable shield is heated. Accordingly, the distance D at the central position (marked (2)) may be larger in the unheated state shown in FIG. 5A than in the heated state shown in FIG. 5B, for example by 0.5 mm or more or even 1 mm or more. In particular, if (1) the temperature difference between the room temperature and the operation temperature is about 500° C., and (2) the heatable shield is made of stainless steel or a material with a similar thermal expansion coefficient, the difference D at the central position (marked (2)) may be about 2.3 mm in FIG. 5A and about 1 mm in FIG. 5B.

If the heatable shield is radially fixedly mounted at end portions thereof in the circumferential direction, allowing a central portion of the heatable shield to radially move, a second distance between the edge exclusion portion and the curved drum surface in end sections of the heatable shield (marked (1) in FIG. 5A and FIG. 5B) hardly moves radially inwardly when the heatable shield is heated. Accordingly, the distance D at an end position (marked (1)) in FIG. 5A and in FIG. 5B may essentially correspond to each other, because there is hardly any thermally caused movement at the end portion of the heatable shield when the heatable shield is heated.

Summarizing the above, the heatable shield may be mounted such, that—at room temperature—the gap width varies in the circumferential extension, such that a varying thermal movement of the edge exclusion portion radially inwardly is pre-compensated and—at the operation temperature—an essentially constant and small gap width can be provided.

Figure 6:
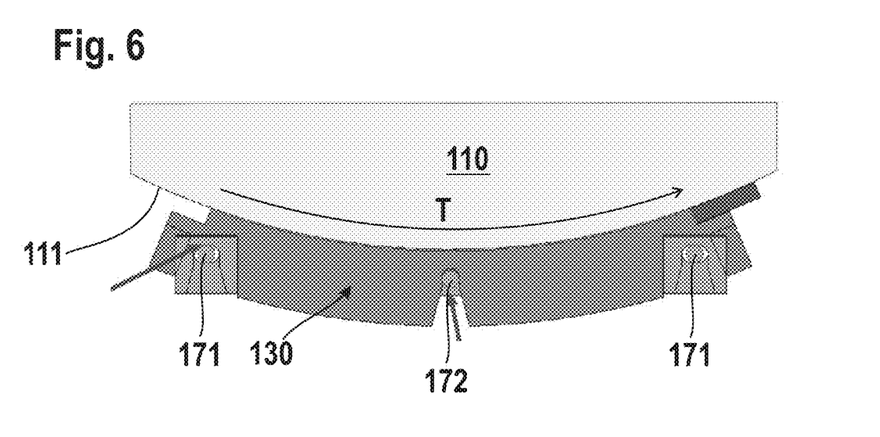
FIG. 6 shows a partial sectional view of a vapor deposition apparatus according to embodiments of the present disclosure.

FIG. 6 illustrates a fixing of the heatable shield, such that a heating of the heatable shield leads to thermal movement of the heatable shield, providing a constant gap width between the heatable shield and the curved drum surface over the full extension of the heatable shield in the circumferential direction.

At least three alignment pins 171, 172 protruding into respective alignment recesses may be provided for holding the heatable shield 130 such that the edge exclusion portion 131 of the heatable shield faces toward the curved drum surface and is arranged at a close distance thereto. The at least three alignment pins 171, 172 may be spaced-apart from each other in the circumferential direction and protrude into respective alignment recesses for positioning the heatable shield at a predetermined radial distance from the rotatable drum with a sub-mm deviation over the full extension of the heatable shield in the circumferential direction when the heatable shield is heated, particularly with a deviation of less than 100 µm or less than 50 µm.

For example, two outer alignment pins 171 may not allow any radial movement of the heatable shield at the positions of the two outer alignment pins 171, but may optionally allow for a movement of the heatable shield in the circumferential direction T at the positions of the two outer alignment pins 171. In particular, the two outer alignment pins 171 may protrude into recesses that are elongated in the circumferential direction, but do not provide any play in the radial direction. Since the two outer alignment pins 171 do not allow a movement of the heatable shield in the radial direction, a gap width at the position of the two outer alignment pins 171 may remain essentially constant even if the heatable shield is heated.

An inner alignment pin 172 that may allow a movement of the heatable shield at the position of the inner alignment pin 172 in a direction radially inwardly up to an end stop (e.g., provided by a wall of an alignment recess into which the inner alignment pin 172 protrudes) may be arranged, e.g., centrally, between the two outer alignment pins 171. A heating of the heatable shield may lead to a thermally caused movement of the heatable shield at the position of the inner alignment pin 172 radially inwardly, until the inner alignment pin 172 abuts at the end stop, and the heatable shield cannot move any further. At the operation temperature, a first gap width at the position of the inner alignment pin 172 may correspond to a second gap width at the position of the two outer alignment pins 171, and may be in a range from 0.8 mm to 1.5 mm, particularly about 1 mm. If the two outer alignment pins 171 are provided at end portions of the heatable shield in the circumferential direction, the gap may then be constant over the full extension in the circumferential direction, i.e. also at positions between two alignment pins.

Figure 7:
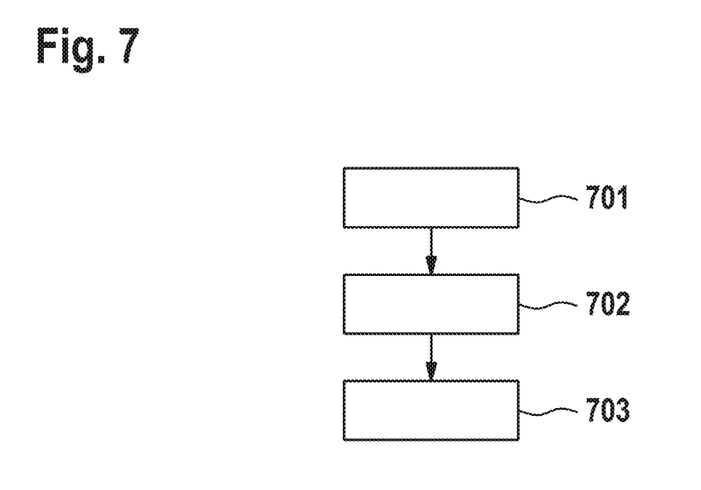
FIG. 7 shows a flowchart for illustrating a method for coating a substrate in a vacuum chamber according to embodiments described herein.

FIG. 7 is a flow diagram for illustrating a method for coating a substrate according to embodiments described herein.

In box 701, a substrate is moved past a vapor source on a curved drum surface of a rotatable drum in a circumferential direction.

In box 702, vapor is directed from a vapor source toward the substrate that is supported on the curved drum surface through a vapor propagation volume. A heatable shield extends from the vapor source toward the curved drum surface and at least partially surrounds the vapor propagation volume. The heatable shield is heated to an operation temperature that is at or above the vapor condensation temperature, in order to reduce or prevent vapor condensation on the heatable shield.

In some embodiments, the vapor source is a metal source, particularly a lithium source, and the vapor is a metal vapor, particularly a lithium vapor. The operation temperature of the heatable shield may be 500° C. or more and 600° C. or less, particularly between 500° C. and 550° C. If the vapor source is a lithium source, an evaporation temperature inside the vapor source may be 600° C. or more and 850° C. or less.

The substrate may be a flexible foil, particularly a flexible metal foil, more particularly a copper foil or a copper-carrying foil, e.g. a foil that is coated with copper on one or both sides thereof. The substrate may have a thickness of 50 µm or less, particularly 20 µm or less, e.g. about 8 µm. Specifically, the substrate may be a thin copper foil having a thickness in a sub 20-µm range.

In some embodiments, the heatable shield may include an edge exclusion portion. For example, a front portion of the heatable shield protruding toward the substrate and arranged at a close distance thereto may be formed as an edge exclusion mask. In box 703, the edge exclusion portion of the heatable shield masks areas of the substrate not to be coated.

The edge exclusion portion may extend in the circumferential direction and follow a curvature of the curved drum surface during vapor deposition. The masking in box 703 may include masking at least one lateral edge or two opposing lateral edges of the substrate.

The heatable shield may define a coating window on the curved drum surface, i.e. a window where the vapor emitted by the plurality of nozzles of the vapor source may impinge on the substrate while the substrate may move past the vapor source.

The masking in box 703 may further include masking at least one inner area of the substrate with a segmentation portion of the heatable shield that extends between two edge exclusion portions. Two (or more) separate coating strips can be deposited on the substrate. In particular, the heatable shield may include a segmentation portion that extends in the circumferential direction and divides the coating window provided by the heatable shield into two or more sub-windows. Each sub-window may have a width of 10 cm or more and 50 cm or less. Two or more separate coating strips with a defined width in the lateral direction L may be deposited on the substrate through the two or more sub-windows.

A maximum distance between the edge exclusion portion and the curved drum surface may be 2 mm or less, particularly about 1 mm, when the heatable shield is heated to the operation temperature. In particular, a gap width between the edge exclusion portion and the curved drum surface may be essentially constant in the circumferential direction, e.g. having an essentially constant width between 0.8 mm and 1.5 mm, e.g. about 1 mm (1 mm+/−15%).

Further, also the segmentation portion may follow the curvature of the curved drum surface along the circumferential direction, and a maximum distance between the segmentation portion and the curved drum surface may be 2 mm or less, particularly about 1 mm, when the heatable shield is heated to the operation temperature. In particular, a gap width between the segmentation portion and the curved drum surface may be essentially constant in the circumferential direction, e.g. having a width value of about 1 mm (1 mm+/−15%).

Figure 8:
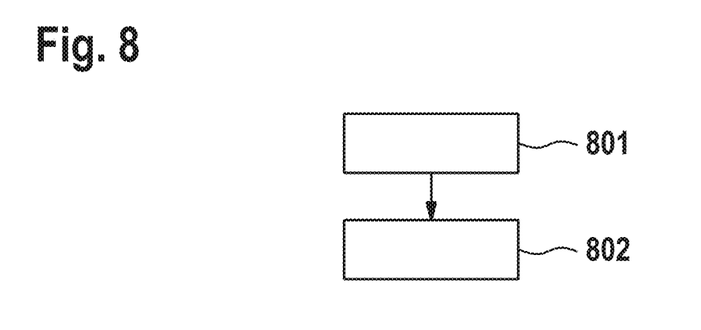
FIG. 8 shows a flowchart for installing a vapor deposition apparatus according to embodiments described herein.

FIG. 8 is a flow diagram for illustrating a method for installing a vapor deposition apparatus according to embodiments described herein.

The method includes, in box 801, providing a rotatable drum with a curved drum surface for supporting a substrate and a vapor source for directing vapor toward the curved drum surface.

The method further includes, in box 802, mounting a heatable shield such that the heatable shield extends from the vapor source toward the curved drum surface, wherein the heatable shield includes an edge exclusion portion extending along the curved drum surface in a circumferential direction and following a curvature thereof. In other words, a curvature of the edge exclusion portion may be adapted to the curvature of the coating drum, such that— when the heatable shield is heated to the operation temperature—the curvature progression of the edge exclusion portion exactly follows a curvature progression of the curved drum surface, providing a constant and small gap between the curved drum surface and the edge exclusion portion.

The mounting in box 802 may include mounting the heatable shield such that a thermally induced expansion of the heatable shield leads to a constant distance between the edge exclusion portion and the curved drum surface along the circumferential direction, particularly to a distance in a range between 0.8 mm and 1.5 mm over the extension of the edge exclusion portion in the circumferential direction.

Specifically, the mounting in box 802 may include mounting the heatable shield such that, in an unheated state of the heatable shield, a first distance between the edge exclusion portion and the curved drum surface in a center section of the heatable shield is different from (e.g., larger than) a second distance between the edge exclusion portion and the curved drum surface in an end section of the heatable shield in the circumferential direction, e.g. by 1 mm or more. The reason is that an end portion of the heatable shield in the circumferential direction may move differently from a center portion of the heatable shield when the heatable shield is heated and thermally expands. Specifically, if the heatable shield is fixedly mounted in the radial direction at two end portions in the circumferential direction, the end portions may move less toward the curved drum surface than the central portion when the heatable shield thermally expands. The mounting of the heatable shield may be such that a constant and very small gap between the edge exclusion portion of the heatable shield and the curved drum surface can be achieved during vapor deposition, when the heatable shield is heated to the operation temperature and has thermally expanded.

For example, the first distance between the edge exclusion portion and the curved drum surface in the center section of the heatable shield may be 2 mm or more, e.g. about 2.3 mm in an unheated state, and/or the second distance between the edge exclusion portion and the curved drum surface in an end section of the heatable shield may be 1.5 mm or less, particularly 1.2 mm or less in an unheated state. After the heating of the heatable shield to the operation temperature, the first distance and the second distance may be essentially the same, e.g. from 0.8 mm to 1.2 mm, particularly about 1 mm.

In other words, the heatable shield is mounted such that the gap width slightly varies in the circumferential direction, e.g. within a variation range of 0.5 mm or more and 2 mm or less, such that—when heated to the operation temperature—the gap width becomes essentially constant along the circumferential direction, providing an accurate edge exclusion of the substrate and a constantly shaped and sharp layer edge.

The heatable shield may be made of a metal material, e.g. of stainless steel, and the above dimensions may be based on the thermal expansion coefficient of stainless steel. For example, stainless steel thermally expands by about 0.88% in length when heated from room temperature to an operation temperature of about 550° C. As will be apparent, the thermal expansion of the heatable shield may depend on the material of the heatable shield, and the respective dimensions and the thermal expansion associated therewith can be adapted based on the used material, such that a constant and small gap width can be achieved between the rotatable drum and the edge exclusion portion during the vapor deposition, if a different material of the heatable shield is used.

Embodiments of the present disclosure provide a temperature-controlled coating chamber environment, for example, to reduce stray coating of components inside the vacuum chamber different from the substrate. Accordingly, advantageously improved substrate coating quality and yield in addition to longer operation times between preventative maintenance cycles can be provided.

In some embodiments, the source material that is evaporated in a crucible of the vapor source can include, for example, metal, in particular lithium, metal alloys, and other vaporizable materials or the like which have a gaseous phase under given conditions. According to yet further embodiments, additionally or alternatively, the material may include magnesium (Mg), ytterbium (Yb) and lithium fluoride (LiF). The evaporated material generated in the crucible can enter a distributor. The distributor can, for example, include a channel or a tube which provides a transport system to distribute the evaporated material along the width and/or the length of the deposition apparatus. The distributor can have the design of a "shower head reactor".

According to embodiments which can be combined with other embodiments describe herein, the evaporated material can include or can consist of lithium, Yb, or LiF. According to embodiments which can be combined with other embodiments described herein, the temperature of the evaporator and/or of the nozzles can be at least 600° C., or particularly between 600° C. and 1000° C., or more particularly between 600° C. and 800° C. According to embodiments which can be combined with other embodiments described herein, the operation temperature of the heatable shield can be between 450° C. and 600° C., particularly between 500° C. and 550° C. with a deviation of +/10° C. or less.

According to embodiments which can be combined with other embodiments described herein, the temperature of the heatable shield is lower than the temperature of the evaporator, e.g., by at least 100° C.

According to embodiments, which can be combined with other embodiments described herein, the heatable shield is passively heated, e.g. by the side wall of the vapor source, for example by radiation. The heatable shield can, for example, be heated by the radiant heat from the side wall of the vapor source, in particular, of the distributor. The term "passively" can be understood that the heatable shield is heated by other components of the vacuum deposition apparatuses exclusively. The heatable shield can be, for example, configured to absorb, to reflect and/or to shield the heat, in particular the radiant heat of the side wall of the vapor source. By lowering the heat directed towards the substrate by the heatable shield, the substrate can be arranged closer to the evaporator which enables a smaller and more compact design of the vacuum chamber.

Furthermore, by heating the heatable shield, the material which is deposited on the surface of the heatable shield, for example, by stray coating can be re-evaporated. The stray coated material on the heatable shield can be advantageously removed by re-evaporation. Furthermore, by re-evaporating material from the heatable shield, the coating on the substrate can also be made more uniform.

In some embodiments, the plurality of nozzles includes three, four or more rows of nozzles. Additionally or alternatively, an array or pattern of openings and/or nozzles may be provided, wherein four or more openings and/or nozzles are arranged in two different directions, e.g. orthogonal directions.

A controller may be configured to actively control the temperature of the heatable shield. Actively controlling can include controlling the electrical power supplied to a heating arrangement and/or can include controlling the flow rate of a heating liquid supplied to the heating arrangement. The controller can be configured to measure the temperature within the vapor source and/or the temperature of the heatable shield. Furthermore, the controller can also be configured to measure the pressure within the vapor source upstream of the plurality of nozzles, inside the vapor propagation volume downstream of the plurality of nozzles and/or inside another part of the vacuum chamber. Moreover, the controller can be configured to control the evaporation rate within the crucible and/or the distribution pipe and/or the deposition rate of the evaporated material on the substrate. The respective parameters can be, for example, the temperature, the rate, and pressure. The respective parameters can be, for example, measured by sensors arranged at the respective components.

According to some embodiments, which can be combined with other embodiments described herein, an anode of a battery is manufactured, and the flexible substrate or web includes copper or consists of copper. According to some implementations, the web may further comprise graphite and silicon and/or silicon oxide. For example, the lithium may pre-lithiate the layer including graphite and silicon and/or silicon oxide.

In particular, the following embodiments are described herein:

Embodiment 1. A vapor deposition apparatus, comprising: a substrate support for supporting a substrate to be coated; a vapor source with a plurality of nozzles for directing vapor toward the substrate support through a vapor propagation volume; and a heatable shield extending from the vapor source toward the substrate support and at least partially surrounding the vapor propagation volume, wherein the heatable shield comprises an edge exclusion portion for masking areas of the substrate not to be coated.

Embodiment 2. The vapor deposition apparatus of embodiment 1, wherein the substrate support is a rotatable drum with a curved drum surface, and the vapor deposition apparatus is configured to move the substrate on the curved drum surface past the vapor source in a circumferential direction.

Embodiment 3. The vapor deposition apparatus of embodiment 2, wherein the edge exclusion portion extends along the curved drum surface in the circumferential direction and follows a curvature thereof.

Embodiment 4. The vapor deposition apparatus of embodiment 2 or 3, wherein at least one of the following applies: (i) a maximum distance between the edge exclusion portion and the curved drum surface is 2 mm or more and 6 mm or less, when the heatable shield is not heated; and (ii) a maximum distance between the edge exclusion portion and the curved drum surface is less than 2 mm, particularly about 1 mm or less than 1 mm, when the heatable shield is heated to an operation temperature.

Embodiment 5. The vapor deposition apparatus of any of embodiments 1 to 4, comprising at least three alignment pins spaced-apart from each other in the circumferential direction and protruding into respective alignment recesses for positioning the heatable shield at a predetermined radial distance from the rotatable drum with a sub-mm deviation over an extension of the heatable shield in the circumferential direction when the heatable shield is heated.

Embodiment 6. The vapor deposition apparatus of any of embodiments 1 to 5, wherein the edge exclusion portion is configured to mask two opposing lateral edges of the substrate.

Embodiment 7. The vapor deposition apparatus of any of embodiments 1 to 6, wherein the heatable shield comprises a segmentation portion for masking an inner substrate area for enabling a deposition of two coating strips.

Embodiment 8. The vapor deposition apparatus of embodiment 7, wherein the segmentation portion divides a coating window provided by the heatable shield into two or more sub-windows having an essentially equal width in a lateral direction.

Embodiment 9. The vapor deposition apparatus of any of embodiments 1 to 8, comprising a heating arrangement for actively or passively heating the heatable shield to a temperature above a vapor condensation temperature, particularly to a temperature of 500° C. or more and 600° C. or less.

Embodiment 10. The vapor deposition apparatus of embodiment 9, further comprising a controller connected to the heating arrangement and configured to control the temperature of the heatable shield to be lower than a temperature inside the vapor source and higher than a vapor condensation temperature in the vapor propagation volume.

Embodiment 11. The vapor deposition apparatus of any of embodiments 1 to 10, wherein the heatable shield is not in contact with the substrate support, such that the substrate support can move relative to the heatable shield and the vapor source during vapor deposition.

Embodiment 12. The vapor deposition apparatus of any of embodiments 1 to 11, wherein the heatable shield surrounds the vapor propagation volume at two lateral sides and at at least one of a substrate entrance side and at a substrate exit side.

Embodiment 13. A vapor deposition apparatus, comprising: a substrate support for supporting a substrate to be coated, wherein the substrate support is a rotatable drum with a curved drum surface; a vapor source with a plurality of nozzles for directing vapor toward the curved drum surface through a vapor propagation volume; and a heatable shield extending from the vapor source toward the curved drum surface and at least partially surrounding the vapor propagation volume, the heatable shield defining a coating window on the curved drum surface.

Embodiment 14. The vapor deposition apparatus of embodiment 13, wherein the heatable shield comprises an edge exclusion portion for masking areas of the substrate not to be coated, the edge exclusion portion extending in a circumferential direction of the rotatable drum and following a curvature of the curved drum surface.

Embodiment 15. A method for coating a substrate in a vacuum chamber, comprising: moving a substrate past a vapor source on a curved drum surface of a rotatable drum in a circumferential direction; directing vapor from the vapor source toward the substrate supported on the curved drum surface through a vapor propagation volume; and heating a heatable shield that extends from the vapor source toward the curved drum surface and at least partially surrounds the vapor propagation volume.

Embodiment 16. The method of embodiment 15, wherein the heatable shield defines a coating window on the curved drum surface and comprises an edge exclusion portion that masks areas of the substrate not to be coated.

Embodiment 17. The method of embodiment 16, wherein the edge exclusion portion extends in the circumferential direction, following a curvature of the curved drum surface and masking at least one lateral edge or two opposing lateral edges of the substrate.

Embodiment 18. The method of embodiment 16 or 17, wherein a gap extending in the circumferential direction is provided between the edge exclusion portion and the curved drum surface, the gap having an essentially constant gap width between about 0.8 mm and about 1.5 mm when the heatable shield is heated to an operation temperature, particularly a constant gap width of about 1 mm.

Embodiment 19. The method of any of embodiments 15 to 18, wherein the heatable shield comprises a segmentation portion that extends in the circumferential direction and divides a coating window provided by the heatable shield into two or more sub-windows, the method comprising: depositing two or more separate coating strips on the substrate through the two or more sub-windows.

Embodiment 20. The method of embodiment 19, wherein the segmentation portion follows a curvature of the curved drum surface along the circumferential direction, and a maximum distance between the segmentation portion and the curved drum surface is 2 mm or less, particularly about 1 mm, when the heatable shield is heated to an operation temperature.

Embodiment 21. The method of any of embodiments 15 to 20, wherein the vapor source is a metal source, particularly a lithium source, and the vapor is a metal vapor, particularly a lithium vapor.

Embodiment 22. The method of any of embodiments 15 to 21, wherein an operation temperature of the heatable shield is between about 500° C. and about 600° C., or wherein an operation temperature inside the vapor source is between about 600° C. and 850° C.

Embodiment 23. The method of any of embodiments 15 to 22, wherein the substrate is a flexible metal foil, particularly a copper foil, more particularly a copper foil with a thickness of 20 µm or less.

Embodiment 24. The method of any of embodiments 15 to 23, wherein vapor impinging on the heatable shield is re-evaporated or reflected.

Embodiment 25. A method for coating a substrate in a vacuum chamber, comprising: supporting a substrate on a substrate support; directing vapor from a vapor source toward the substrate supported on the substrate support through a vapor propagation volume; heating a heatable shield that at least partially surrounds the vapor propagation volume for preventing or reducing vapor condensation on the heatable shield; and masking areas of the substrate not to be coated with an edge exclusion portion of the heatable shield.

Embodiment 26. A method for installing a vapor deposition apparatus, comprising: providing a rotatable drum with a curved drum surface for supporting a substrate and a vapor source for directing vapor toward the curved drum surface; and mounting a heatable shield such that the heatable shield extends from the vapor source toward the curved drum surface and defines a coating window, wherein the heatable shield comprises an edge exclusion portion extending along the curved drum surface in a circumferential direction and following a curvature thereof.

Embodiment 27. The method of embodiment 26, wherein the heatable shield is mounted such that a thermally induced expansion of the heatable shield leads to an essentially constant distance between the edge exclusion portion and the curved drum surface along the circumferential direction, particularly to a distance in a range between 0.8 mm and 1.5 mm.

Embodiment 28. The method of embodiment 26 or 27, wherein the heatable shield is mounted such that, in an unheated state of the heatable shield, a first distance between the edge exclusion portion and the curved drum surface at a center section of the heatable shield is different from a second distance between the edge exclusion portion and the curved drum surface at end sections of the heatable shield in the circumferential direction by 0.5 mm or more and 2 mm or less.

Embodiment 29. A method of manufacturing a coated substrate in a vapor deposition apparatus of any of embodiments 1 to 14, comprising: supporting a substrate on the substrate support of the vapor deposition apparatus; and directing vapor from the vapor source of the vapor deposition apparatus toward the substrate for depositing one or more coating strips on the substrate.

While the foregoing is directed to embodiments, other and further embodiments may be devised without departing from the basic scope, and the scope is determined by the claims that follow.

The invention claimed is:

1. A vapor deposition apparatus, comprising:
a substrate support for supporting a substrate to be coated;
a vapor source with a plurality of nozzles for directing vapor toward the substrate support through a vapor propagation volume; and
a heatable shield mounted at the vapor source, protruding from the vapor source toward the substrate support, at least partially surrounding the vapor propagation volume and forming a side wall of the vapor propagation volume, wherein the heatable shield comprises an edge exclusion portion for masking areas of the substrate not to be coated, wherein the substrate support is a rotatable drum with a curved drum surface, the edge exclusion portion extending along the curved drum surface and following a curvature thereof.

2. The vapor deposition apparatus of claim 1, wherein the vapor deposition apparatus is configured to move the substrate on the curved drum surface past the vapor source in a circumferential direction.

3. The vapor deposition apparatus of claim 2, wherein at least one of the following applies:
(i) the heatable shield is configured such that, in an unheated state of the heatable shield, a maximum distance between the edge exclusion portion and the curved drum surface is 2 mm or more and 6 mm or less; and
(ii) the heatable shield is configured such that, in a heated state of the heatable shield, a maximum distance between the edge exclusion portion and the curved drum surface is less than 2 mm.

4. The vapor deposition apparatus of claim 1, comprising at least three alignment pins spaced-apart from each other in a circumferential direction and protruding into respective alignment recesses for positioning the heatable shield at a predetermined radial distance from the rotatable drum with a sub-mm deviation over an extension of the heatable shield in the circumferential direction in a heated state of the heatable shield.

5. The vapor deposition apparatus of any of claim 1, wherein the edge exclusion portion is configured to mask two opposing lateral edges of the substrate.

6. The vapor deposition apparatus of claim 1, wherein the heatable shield comprises a segmentation portion for masking an inner substrate area for enabling a deposition of two coating strips.

7. The vapor deposition apparatus of claim 6, wherein the segmentation portion divides a coating window provided by the heatable shield into two or more sub-windows having an essentially equal width in a lateral direction.

8. The vapor deposition apparatus of claim 1, comprising a heating arrangement for actively or passively heating the heatable shield to a temperature above a vapor condensation temperature.

9. The vapor deposition apparatus of claim 8, further comprising:
a controller connected to the heating arrangement and configured to control the temperature of the heatable shield to be lower than a temperature inside the vapor source and higher than a vapor condensation temperature in the vapor propagation volume.

10. The vapor deposition apparatus of claim 1, wherein the heatable shield is not in contact with the substrate support, such that the substrate support can move relative to the heatable shield and the vapor source during vapor deposition.

11. The vapor deposition apparatus of claim 1, wherein the heatable shield surrounds the vapor propagation volume at two lateral sides and at at least one of a substrate entrance side and at a substrate exit side.

12. A vapor deposition apparatus, comprising:
a substrate support for supporting a substrate to be coated, wherein the substrate support is a rotatable drum with a curved drum surface;
a vapor source with a plurality of nozzles for directing vapor toward the curved drum surface through a vapor propagation volume; and
a heatable shield mounted at the vapor source, protruding from the vapor source toward the curved drum surface, at least partially surrounding the vapor propagation volume and forming a side wall of the vapor propagation volume, the heatable shield defining a coating window on the curved drum surface, wherein the heatable shield comprises an edge exclusion portion for masking areas of the substrate not to be coated, the edge exclusion portion extending in a circumferential direction of the rotatable drum and following a curvature of the curved drum surface.

13. A method for coating a substrate in a vacuum chamber, comprising:
   moving a substrate past a vapor source on a curved drum surface of a rotatable drum in a circumferential direction;
   directing vapor from the vapor source toward the substrate supported on the curved drum surface through a vapor propagation volume; and
   heating a heatable shield that is mounted at the vapor source, protrudes from the vapor source toward the curved drum surface, at least partially surrounds the vapor propagation volume and forms a side wall of the vapor propagation volume, wherein the heatable shield comprises an edge exclusion portion for masking areas of the substrate not to be coated, the edge exclusion portion extending in the circumferential direction and following a curvature of the curved drum surface.

14. The method of claim 13, wherein the heatable shield defines a coating window on the curved drum surface.

15. The method of claim 14, wherein the edge exclusion portion and masks at least one lateral edge or two opposing lateral edges of the substrate.

16. The method of claim 14, wherein a gap extending in the circumferential direction is provided between the edge exclusion portion and the curved drum surface, the gap having an essentially constant gap width between about 0.8 mm and about 1.5 mm when the heatable shield is heated to an operation temperature.

17. The method of claim 13, wherein the heatable shield comprises a segmentation portion that extends in the circumferential direction and divides a coating window provided by the heatable shield into two or more sub-windows, the method comprising:
   depositing two or more separate coating strips on the substrate through the two or more sub-windows.

18. The method of claim 13, wherein the vapor source is a lithium source, and the vapor is a lithium vapor.

* * * * *